(12) United States Patent
Yilmaz et al.

(10) Patent No.: US 10,032,861 B2
(45) Date of Patent: Jul. 24, 2018

(54) SEMICONDUCTOR DEVICE WITH FIELD THRESHOLD MOSFET FOR HIGH VOLTAGE TERMINATION

(71) Applicant: Alpha and Omega Semiconductor Incorporated, Sunnyvale, CA (US)

(72) Inventors: Hamza Yilmaz, Saratoga, CA (US); Madhur Bobde, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/721,892

(22) Filed: Sep. 30, 2017

(65) Prior Publication Data

US 2018/0026094 A1 Jan. 25, 2018

Related U.S. Application Data

(62) Division of application No. 15/407,731, filed on Jan. 17, 2017, now Pat. No. 9,793,346, which is a division of application No. 14/329,938, filed on Jul. 12, 2014, now Pat. No. 9,548,352, which is a division of application No. 13/135,985, filed on Jul. 19, 2011, now Pat. No. 8,802,529.

(51) Int. Cl.
| | |
|---|---|
| *H01L 29/66* | (2006.01) |
| *H01L 29/06* | (2006.01) |
| *H01L 27/082* | (2006.01) |
| *H01L 27/088* | (2006.01) |
| *H01L 29/78* | (2006.01) |
| *H01L 29/40* | (2006.01) |
| *H01L 29/739* | (2006.01) |

(52) U.S. Cl.
CPC ........ *H01L 29/0623* (2013.01); *H01L 27/088* (2013.01); *H01L 27/0823* (2013.01); *H01L 29/404* (2013.01); *H01L 29/407* (2013.01); *H01L 29/7397* (2013.01); *H01L 29/7811* (2013.01)

(58) Field of Classification Search
CPC ............ H01L 29/0623; H01L 29/7397; H01L 29/404; H01L 29/407; H01L 27/0823; H01L 29/7811; H01L 27/088
See application file for complete search history.

(56) References Cited

U.S. PATENT DOCUMENTS

| | | | | |
|---|---|---|---|---|
| 8,802,529 B2 * | 8/2014 | Yilmaz | ................. | H01L 27/088 257/173 |
| 2011/0073906 A1 * | 3/2011 | Bobde | ................. | H01L 29/7806 257/147 |
| 2013/0193512 A1 * | 8/2013 | Weis | ................... | H01L 27/0207 257/337 |
| 2014/0138737 A1 * | 5/2014 | Bobde | ................... | H01L 29/402 257/140 |

* cited by examiner

*Primary Examiner* — Victor A Mandala
(74) *Attorney, Agent, or Firm* — Bo-In Lin

(57) ABSTRACT

This invention discloses a semiconductor power device disposed in a semiconductor substrate comprising a lightly doped layer formed on a heavily doped layer and having an active cell area and an edge termination area. The edge termination area comprises a plurality P-channel MOSFETs. By connecting the gate to the drain electrode, the P-channel MOSFET transistors formed on the edge termination are sequentially turned on when the applied voltage is equal to or greater than the threshold voltage Vt of the P-channel MOSFET transistors, thereby optimizing the voltage blocked by each region.

9 Claims, 10 Drawing Sheets

SEMICONDUCTOR DEVICE WITH FIELD THRESHOLD MOSFET FOR HIGH VOLTAGE TERMINATION

BACKGROUND OF THE INVENTION

1. Field of the Invention

The invention relates generally to the semiconductor power devices. More particularly, this invention relates to configurations and methods for manufacturing of new and improved edge terminations for high voltage (HV) devices for improved reliability and to reduce the areas occupied by the termination areas while maintaining high breakdown voltages.

2. Description of the Prior Art

Conventional floating guard rings in the termination area are not reliable especially products housed in plastic packages due to spacing of the Floating Guard Rings (FGR) and the charge from dielectric layer under the metal layer, passivation film, and/or charge from the plastic molding compounds. Other high voltage (higher than 400V) termination structures, such as Junction Termination Extension (JTE), Field Guard Ring and Field Plate (FGR-FP), minimize sensitivity of FGR type high voltage (HV) termination.

"Optimization and Surface Charge Sensitivity of High Voltage Blocking Structures with Shallow Junctions" by the inventor, Hamza Yilmaz, published in IEEE Transactions on Electron Devices, vol. 38, No. 3, July 1991, pp. 1666-167, discloses a high voltage blocking and termination structure using offset (optimum) multiple field plate and field-limiting ring (OFP-FLR) structure and optimized multiple zone JTE (MZ-JTE) structure to improve the breakdown voltage without additional passivation and process complexities. In the OFP-FLR structure, each field limiting ring has a field plate covering most of the surface space between two adjacent field limiting rings located at the surface of the silicon substrate with a gap between two field plates. A multiple zone JTE structure includes multiple lightly p-doped zones located at the surface of the silicon substrate and next to each other with the first p-JTE is next to the p+ electrode.

"Junction termination extension (JTE), A New Technique for Increasing Avalanche Breakdown Voltage and Controlling Surface Electric Fields in P-N Junctions" by Victor A. K. Temple, published in International Electron Devices Meeting, 1977, PP. 423-426, discloses a method of forming a junction termination extension to improve the breakdown voltage using implantation rather than by shaping or etching an already present semiconductor substrate. The advantages of this method are immediately apparent-control over the actual dopant charge to one percent accuracy and added flexibility in that the implant step can be done almost anywhere during processing.

U.S. Pat. No. 6,011,298 discloses a high voltage termination structure with buried field-shaping region for increasing a breakdown voltage. The termination structure includes a buried field-shaping region, such as a buried field-shaping ring, separated from and beneath the device region with a distance sufficient to permit a depletion region to form between the buried field-shaping region and the device region when a first voltage is applied between the device region and the substrate and to produce a larger radius of curvature of the depletion region formed about the device region when a second voltage that is larger than the first voltage is applied between the device region and the substrate.

U.S. Pat. No. 4,158,206 discloses semiconductor device, which includes a body of semiconductor material having a PN junction terminating at a major surface, with buried field limiting rings formed within the body and extending around a portion of the PN junction. Buried field limiting rings reduce the electric field intensity at the surface intercept of the reverse biased PN junction, thus increase the reverse bias voltage sustainable by the PN junction of interest and increase the breakdown voltage of the semiconductor material.

However conventional FGR-FP does not completely shield surface of the HV termination region from charges from wafer surface passivation films and/or assembly and package material (i.e., molding compound and assembly site).

The present invention provides a termination configuration that completely seals the surface of the HV termination region with poly Silicon or metal gate MOSFET structures.

SUMMARY OF THE PRESENT INVENTION

It is therefore an aspect of the present invention to provide a new and improved edge termination configuration to reduce the electrical field crowding effects near the blocking junction at the device edge and provide a compact termination with lower surface electric field that is less sensitive to surface charge. This is achieved with the formation of a plurality of P-channel MOSFETs in the N region and between two P-type diffusion regions or between two floating guard rings (FGRs). In one embodiment, a poly silicon or metal layer covering an oxide layer are deposited at the region between the FGRs. This poly silicon or metal layer functions as a planar gate for the P-channel MOSFET transistors. In another embodiment, a gate material filled in a trench functions as a trench gate for the P-channel MOSFET transistor. By connecting the gate to the drain electrode, the P-channel MOSFET transistors act as a chain in the termination area, between the active area and the scribe region (die edge), in a cascade fashion. Threshold voltage of the P-channel MOSFET will determine the level of the potential of each floating guard ring. This new HV termination structure can be applied to planar as well as Trench based HV devices.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
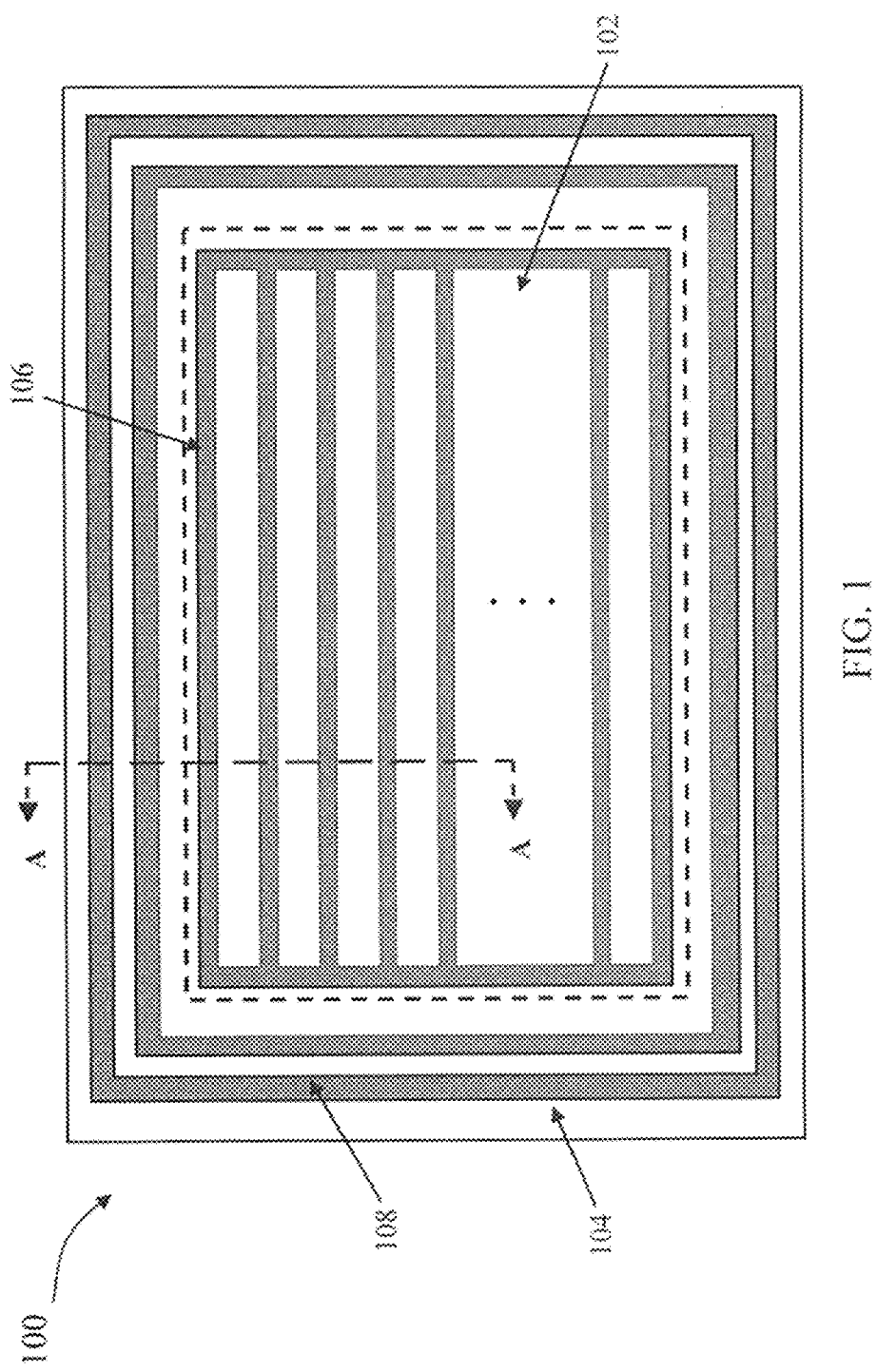
FIG. 1 is a top view of a layout of a high voltage (HV) device.

FIG. 1 is a top view of a layout of a HV device 100, such as a HV MOSFET or a HV IGBT, which includes an active area 102 and a termination area 104. The active area 102 of high voltage (HV) device 100 includes a plurality of either planar gate HV MOSFETs/IGBTs or trench gate HV MOSFETs/IGBTs 106. The termination area 104 includes a plurality of P-channel MOSFETs 108 connected in series, referred to as field threshold MOSFETs. The field threshold MOSFETs are formed in termination area to sustain a high breakdown voltage.

Figure 2:
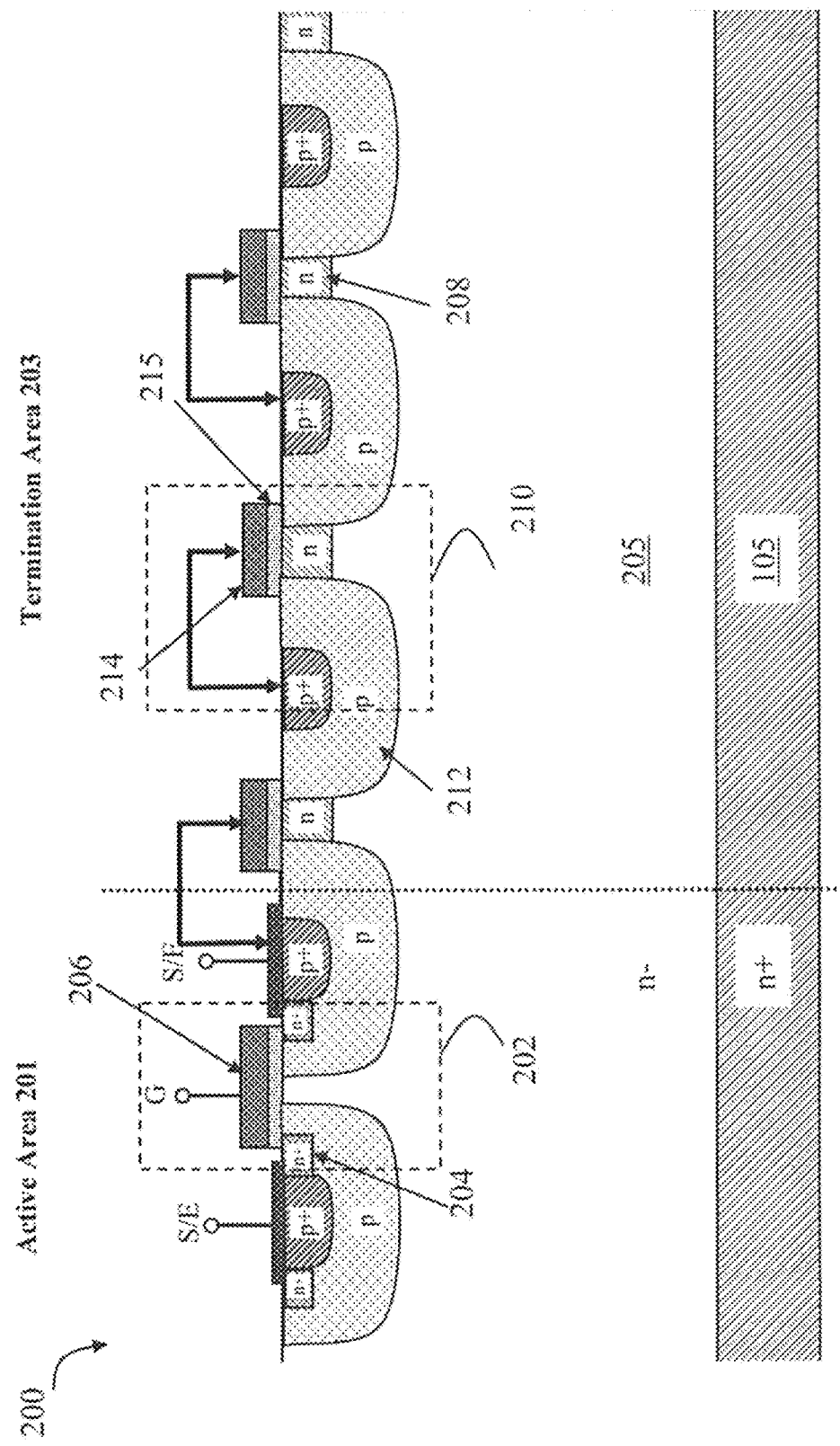
FIG. 2 is a cross-sectional view of the HV device described in FIG. 1 along the line A-A according to a first embodiment of the present invention.

FIG. 2 is a cross-sectional view of a planar gate HV device 200 of the type depicted in FIG. 1 along line A-A according to a first embodiment of the present invention. The HV device 200 is formed on a semiconductor substrate including a lightly doped N-type layer 205 supported on top of a heavily doped layer 105. The doping polarities of heavily doped layer 105 and the lightly doped layer 205 are the same for a HV MOSFET device and are opposite for a HV IGBT device. For simplicity the description in this application only illustrates a HV MOSFET device. The HV device 200 includes an active area 201 and a termination area 203. The active area 201 includes a plurality of planar gate N-channel vertical MOSFETs 202, each of which includes an n+ source 204, a drain formed in the n+ substrate 105 and a planar gate 206. The termination area 203 includes a plurality of P-channel MOSFETs 210, each of which locates between two P-type diffusion regions or two floating guard rings (FGRs) 212. The P-type floating guard rings have a heavier doping concentration than the lightly doped N-type layer 205. The plurality of termination FGRs are formed to have a distance ranging from 1 to 10 microns between two adjacent termination FGRs and a depth into the semiconductor substrate ranging from 0.5 to 8 microns. Each P-channel MOSFET 210 contains a conductive layer such as doped polysilicon or metal layer 214 insulated from the semiconductor substrate by an oxide layer 215, which is deposited at the region between two FGRs 212 forming a planar gate lateral MOSFET with the two FGRs 212 on each side of the of the polysilicon or metal layer 214 functioning as the source and drain of the lateral P-channel MOSFET. This poly silicon or metal layer 214 functions as a planar gate for the P-channel MOSFET 210. Each FGR 212 between two gate sections of polysilicon or metal layer 214 in termination area 203 functions as the drain of one P-channel MOSFET 210 and the source for the other P-channel MOSFET. The drain and source regions disposed on two opposite sides of the gate section having a dopant concentration ranging from $1e17$ $cm^{-3}$ to $1e20$ $cm^{-3}$. By connecting the gate 214 to the drain electrode 212 of the P-Channel MOSFET (Drain of the P-Channel MOSFET is the p-region with lower Potential), the P-channel MOSFET transistors 210 act as a chain in the termination area 203 in a cascade fashion. Threshold voltage of the P-channel MOSFET will determine the level of the potential of each floating guard ring (FGR) and can be adjusted by using a surface implant, for example n-type implant, to alter the doping of the top region 208. The FGR 212 may be formed at the same time the P body region of the active transistor is formed with the same dopant density and the gate 214 of lateral MOSFET in termination area may be formed in the same process of forming active transistor planar gate. A high dope contact implant may be formed in the FGR 212 in the same way as the contact implant in active area for improving the electrical contact to the FGR 212.

Figure 3:
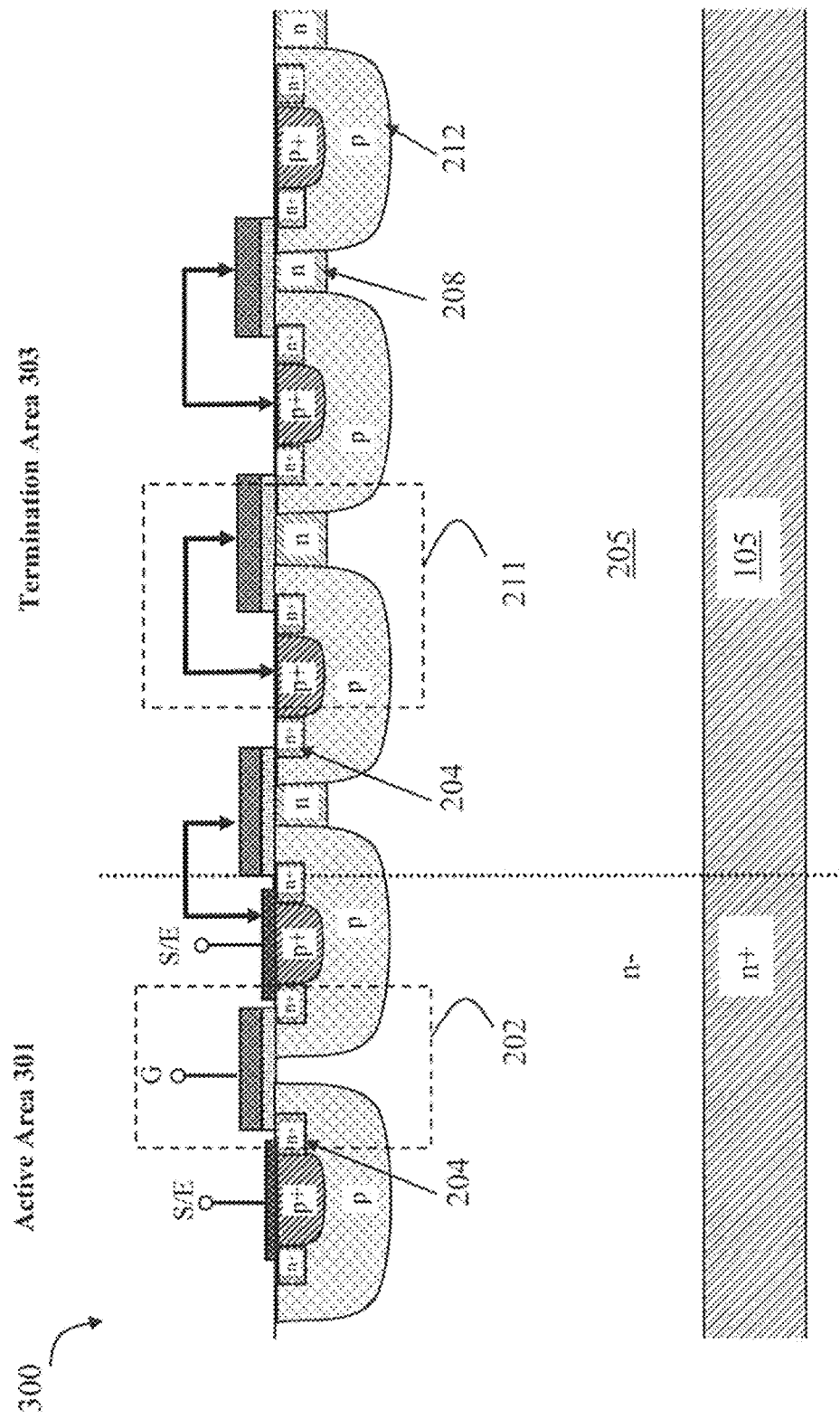
FIG. 3 is a cross-sectional view illustrating an alternative configuration of the HV device described in FIG. 2.

FIG. 3 is a cross-sectional view illustrating an alternative configuration of the HV device 200 described in FIG. 2. The device 300 of FIG. 3 is similar to the device 200 except that the P-channel MOSFETs 211 in the termination area 303 of the device 300 also include n+ dummy source regions 204 that are not blocked in the termination area 303 in the process of source implant in active area. The P-channel MOSFETs 211 are functioning as the same way as in P-channel MOSFET 210 shown in FIG. 2. Furthermore, the n+ dummy source regions 204 also configure the planar gate MOSFETs as in termination area as N-channel vertical MOSFETs with the gates shorted to the source/body regions therefore never turn on.

Figure 4:
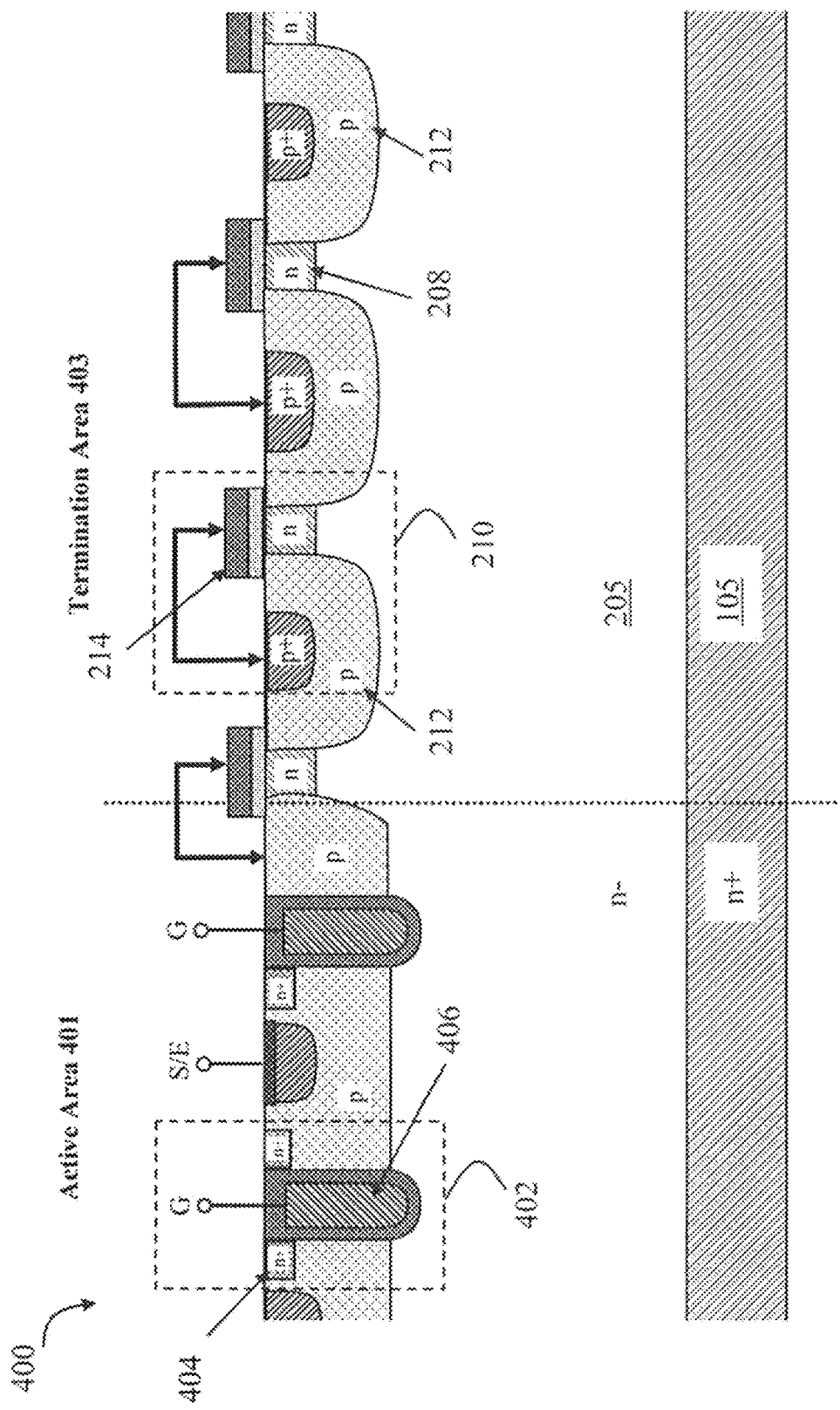
FIG. 4 is a cross-sectional view of the HV device described in FIG. 1 along the line A-A according to a second embodiment of the present invention.
Figure 5:
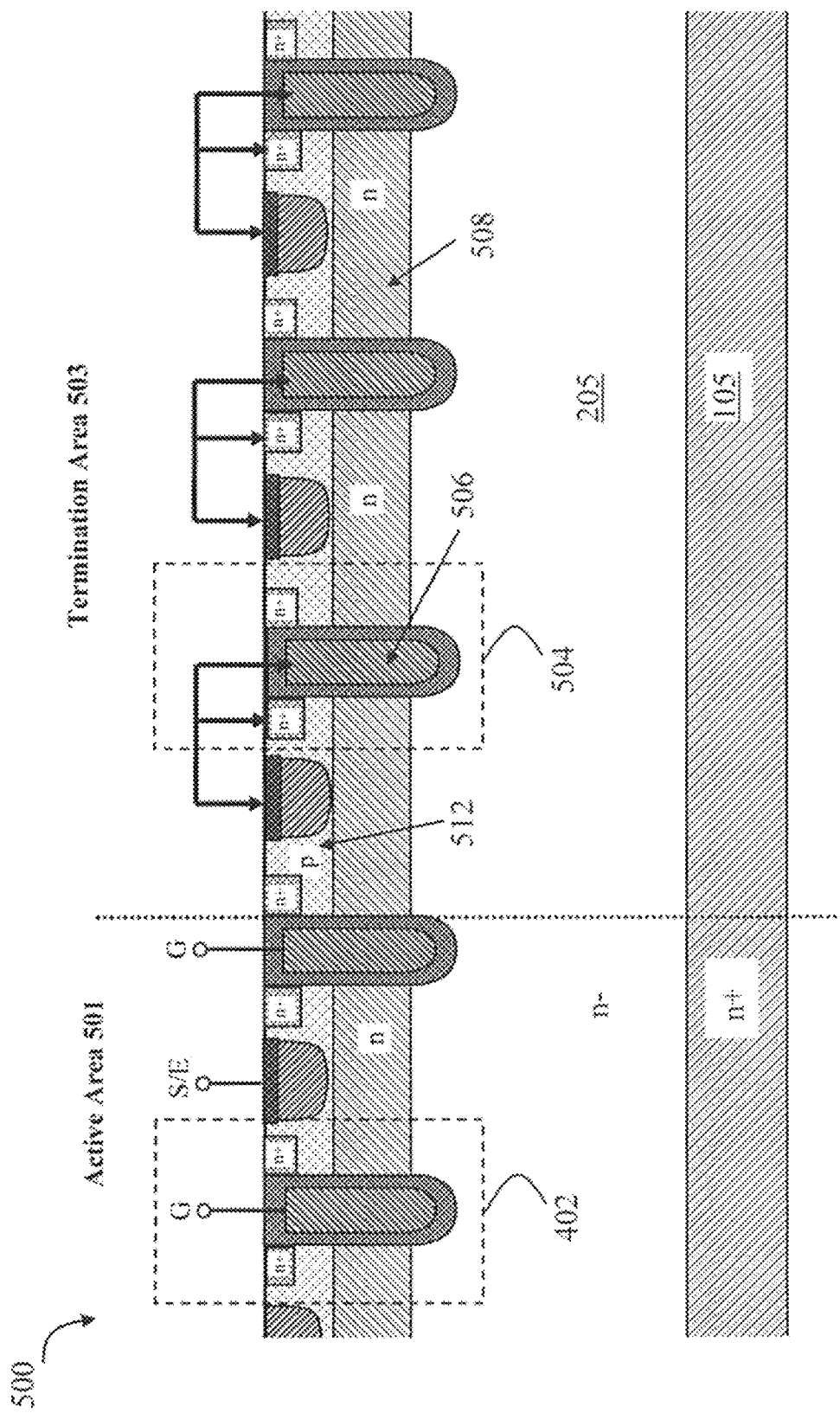
FIG. 5 is a cross-sectional view of the HV device described in FIG. 1 along the line A-A according to a third embodiment of the present invention.

The new HV termination structure of the present invention using the field threshold MOSFETs as shown in FIGS. 2-3 also can be applied to Trench gate HV device as shown in FIGS. 4-5.

FIG. 4 is a cross-sectional view illustrating a trench gate high voltage (HV) device 400 according to a second embodiment of the present invention. The active area 401 of the device 400 includes a plurality of trench gate vertical N-channel MOSFETs 402, each of which includes an n+ source 404, a trench gate 406 and a drain formed in the n+ substrate 105. Similar to device 200 of FIG. 2, the termination area 403 of the device 400 includes a plurality of P-channel planar gate lateral MOSFETs 210, each of which locates between two P-type diffusion regions or between two FGRs 212, with the gate 214 connecting to the drain electrode 212. The P-channel MOSFET transistors 210 act as a chain between the active area and the scribe region (die edge) in a cascade fashion as described above. The FGR 212 may be formed at the same time the P body region of the active transistor is formed with the same dopant density. Alternatively, the termination area 403 can includes a plurality of P-channel MOSFETs 211 as shown in FIG. 3.

FIG. 5 is a cross-section view illustrating another trench gate HV device 500 according to a third embodiment of the present invention. In this embodiment, the active area 501 includes a plurality of trench gate vertical N-channel MOSFETs 402 of the type depicted in FIG. 4. The termination area 503 includes a plurality of trench gate P-channel lateral MOSFETs 504, each of which has the same structure as the trench gate MOSFET 402 and locates between two P-type diffusion regions or two FGRs 512. The plurality of termination trenches are formed to have a distance ranging from 0.5 to 5 microns between two adjacent termination trenches and a depth into the semiconductor substrate ranging from 0.5 to 8 microns. The gate material 506 of each P-channel MOSFET 504 functions as a trench gate and is connected to a drain electrode 512 (Drain of the Trench MOSFET is the p-region with more negative Potential). Each FGR 512 between two trench gate 506 in termination area 503 functions as the drain of one P-channel MOSFET 504 and the source for the other P-channel MOSFET. By connecting the gate to the drain electrode, the P-channel MOSFET transistors 504 act as a chain in the termination area in a cascade fashion as described above. Threshold voltage of the trench MOSFET will determine the level of the potential of each floating guard ring (FGR) and can be adjusted by using implant, for example n-type implant, or changing the doping concentration during the epitaxial grown of the region 508. The embodiment shown in FIG. 5 shows the threshold adjustment layer 508 extending into the active area 501. In another embodiment (not shown) the threshold adjustment layer 508 may be formed through implant in the termination area only without extending into the active area 501. The threshold adjustment layer 508 has a dopant concentration higher than the epitaxial layer 205. In one embodiment the threshold adjustment layer 508 has a dopant concentration higher than the P body region of active area. The FGR 512 may be formed at the same time the P body region of the active transistor is formed with the same dopant density. A high dope contact implant may be formed in the FGR 512 in the same way as the contact implant in active area for improving the electrical contact to the FGR 512.

Figure 6:
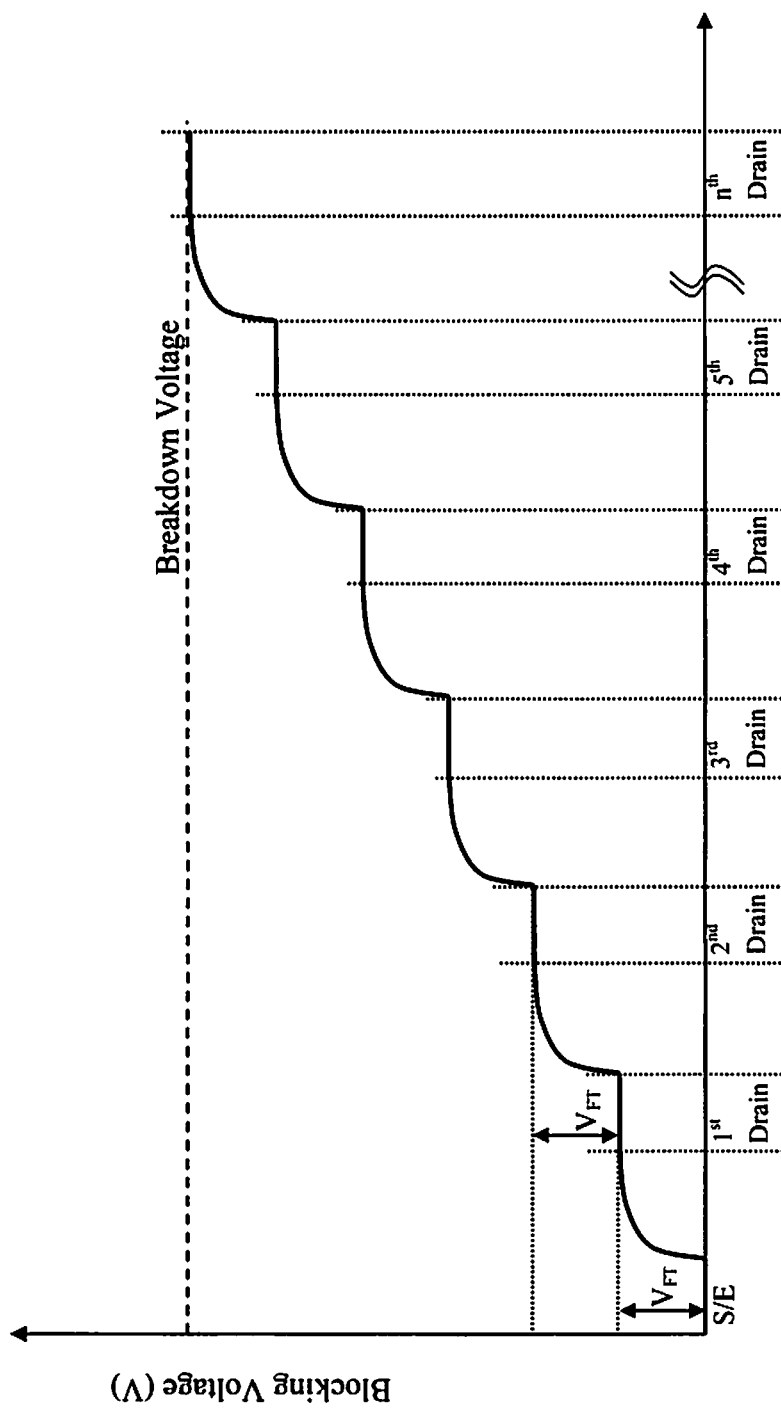
FIG. 6 is a plot illustrating the electric potential distribution on the surface of the silicon at the termination area of a HV device.
Figure 7:
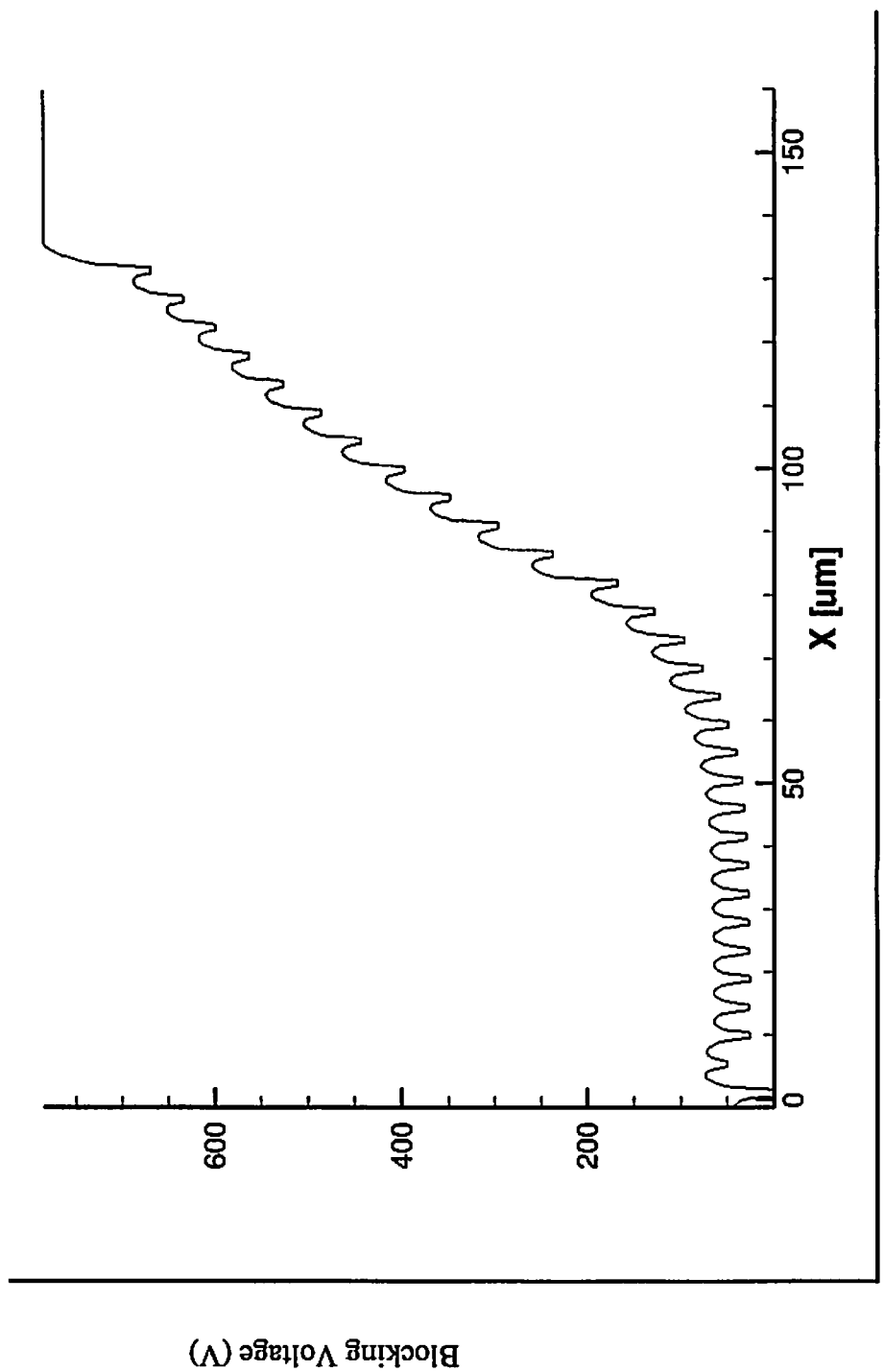
FIG. 7 is a plot showing a simulation of electric potential distribution on the surface of the silicon at the termination area of a HV device.
Figure 8:
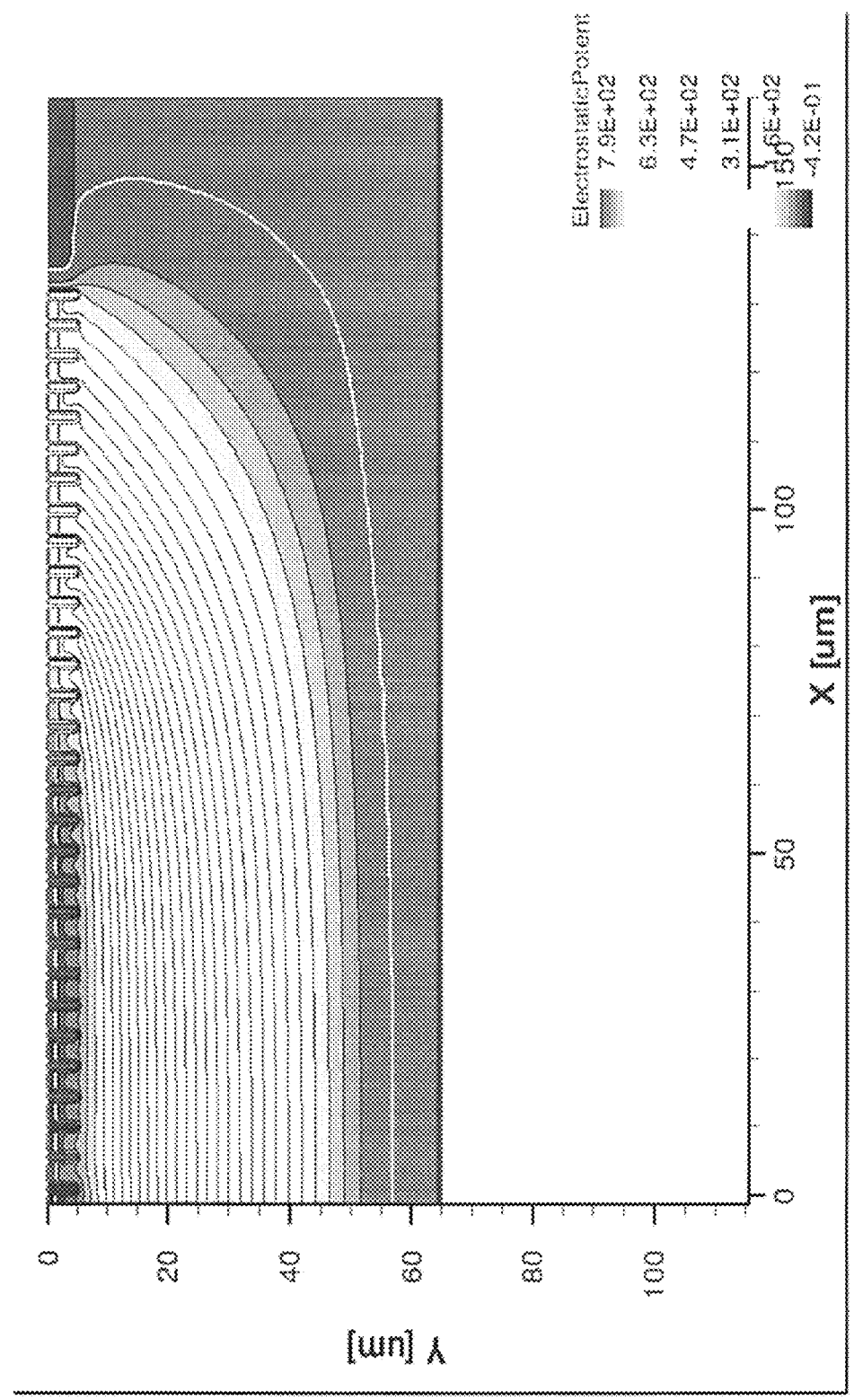
FIG. 8 is an image showing the potential lines in the silicon substrate at the termination area.

In order to implement each of these P-channel MOSFETs as a field threshold MOSFET, instead of leaving the gates to have a floating voltage or shorting the gates to the source, in which the P-channel MOSFET is never turned on; each gate is connected to its corresponding drain electrode thus the gate electrode and the drain electrode are same potential. When a threshold voltage Vt is applied to the device, i.e., Vds=Vgs=Vt, where Vds is the drain to source voltage, Vgs is the gate to source voltage, each of these P-channel MOSFET is turned on. As the voltage applied to the power device increases, these plurality of P-channel MOSFETs are sequentially turned on to sustain gradually increasing voltage applied to the device. The potential climbs up uniformly at a field threshold voltage, for example 50V, per P-channel MOSFET or per trench. Therefore the number of P-channel MOSFETs needed depends on the design breakdown voltage of the HV device. Typically, there are about 1 to 25 P-channel MOSFETs formed in an edge termination area of a width ranging from 5 microns to 250 microns. The field threshold based termination with these multiple P-channel MOSFETs can therefore sustain high breakdown voltage. FIG. 6 is a plot showing potential distribution on the surface of the silicon substrate with a number of P-channel MOSFETs formed at the termination area. FIG. 7 is a plot showing a simulation of the electric potential distribution at the surface of the silicon substrate at the termination area. FIG. 8 is an image showing potential lines flattering in the silicon substrate thus reducing the electric field crowing and significantly increases the breakdown voltage without requiring large termination area.

Absolute value of the threshold voltage of P-Channel MOSFET can be optimized to achieve high breakdown voltage with optimum HV termination size. Low Vt requires more P-channel MOSFETs and thus the termination area becomes larger. In contrast, high Vt will not yield desired breakdown voltage at the termination area and breakdown voltage of the Device will be lower than a target. Vt of the P-channel MOSFET's can be adjusted with the required high breakdown voltage specification by adjusting oxide thickness, or localized surface concentration adjustment either increasing N-type doping concentration to increase Vt, or decrease the Vt by counter doping the N-type region's concentration. The threshold voltage Vt is ranging from 0.5 to 80 volts.

Figure 9A:
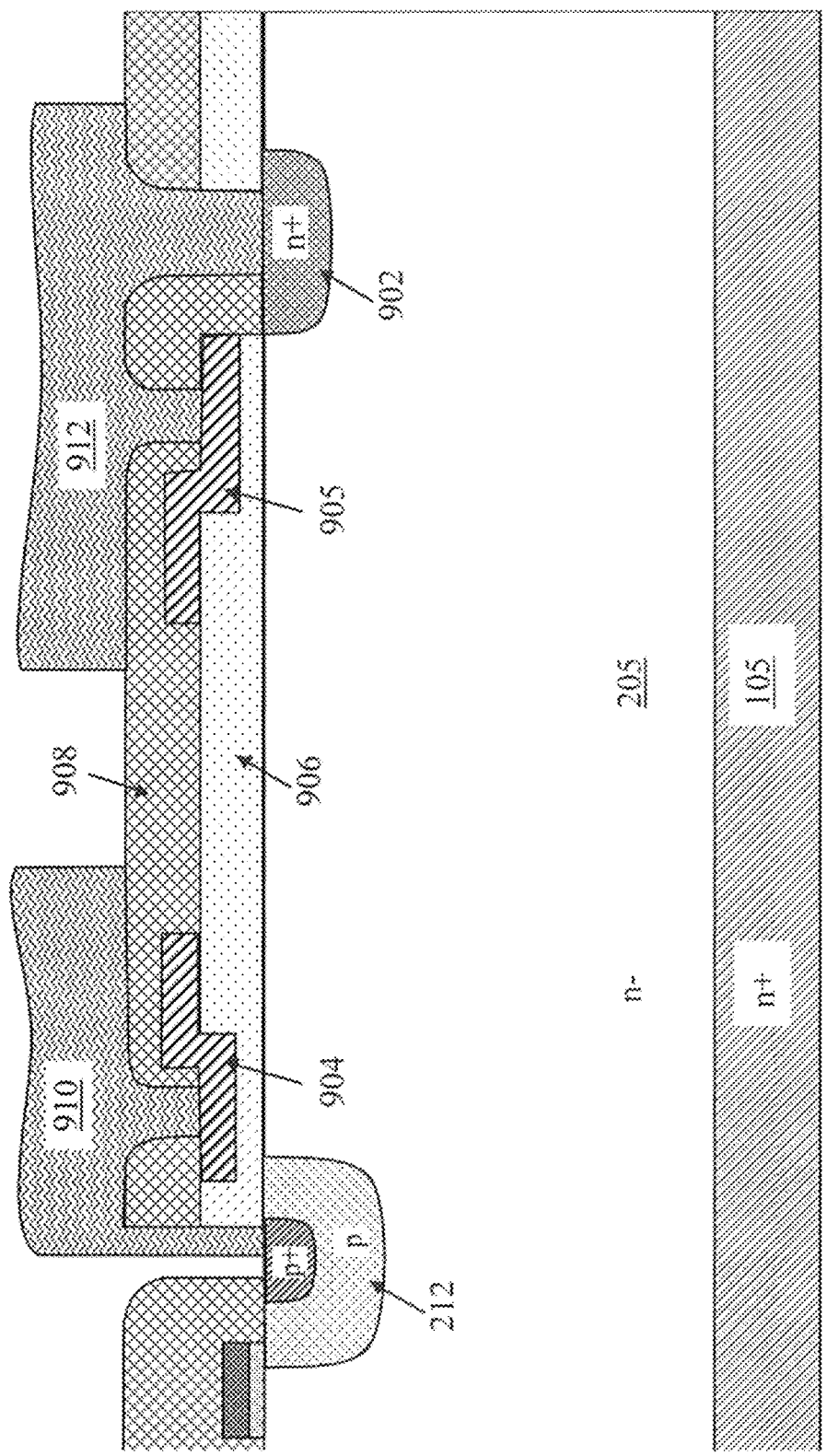
FIGS. 9A-9 are cross-section views showing the HV termination structures with field plates and a channel stop region for HV devices.
Figure 9B:
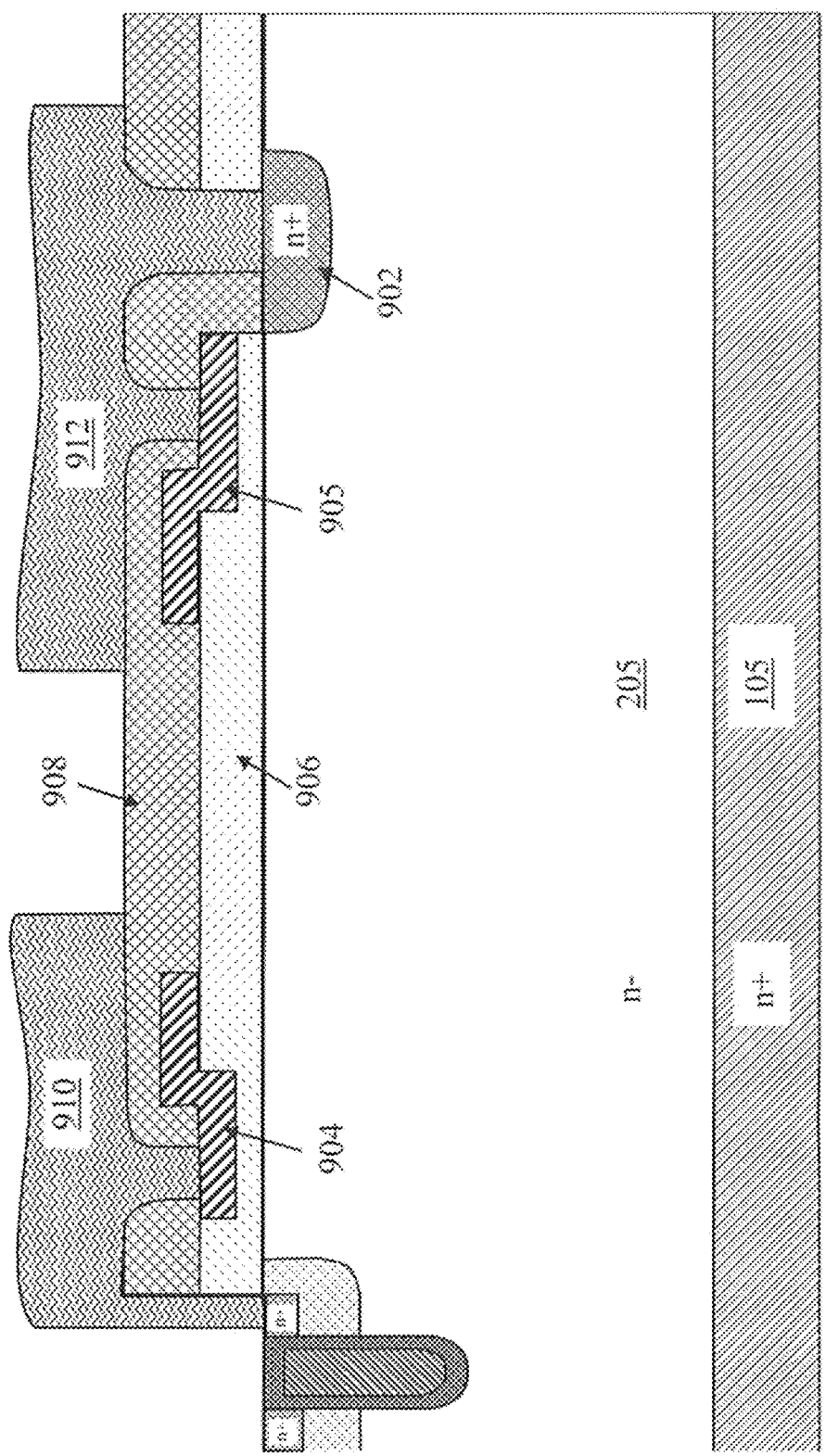

FIGS. 9A-9B are cross section views illustrating the end portions of the HV termination structures of the type depicted in FIGS. 2 to 5 combining with a first field plate formed adjacent to the last P-type diffusion region or last floating guard rings and a field plate formed at the channel stop region to further expand high voltage blocking capability of the edge termination.

As shown in FIGS. 9A-9B, a first field plate 904 is formed adjacent to the last P-type diffusion region or last floating guard ring 212 as shown in FIGS. 3 and 5. The first field plate 904 extends from the last floating guard ring 212 towards the scribe line 920. The first field plate 904 is electrically connected to the last floating guard ring 212 through a metal 910. A heavily doped channel stop region 902 of the same conductivity type of the lightly doped layer of the semiconductor substrate, e.g., N+ doped region 902, is formed at the surface of the semiconductor substrate near the edge of the termination area for stopping the electric field at the surface of the semiconductor substrate. A second field plate 905 is also formed adjacent to the channel stop region 902 and extends from the channel stop region 902 towards the active area. The second field plate 905 and the channel stop region 902 are electrically connected to each other by metal 912. The field plates 904 and 905 are electrically isolated from the silicon substrate by a field oxide layer 906 and are isolated from each other by a Borophosphosilicate glass (BPSG) layer 908. The field plates 904 and 905 spread the electric field at the edge of the termination area, thus increasing the breakdown voltage.

The HV device termination structure of the present invention can also be applied to many types of high voltage devices, including MOSFET, IGBT, JFET/SIT N-drift Diode type structures. The embodiments only illustrate N Channel devices. P Channel devices may be implanted by switching the doping polarity types.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a Semiconductor Power device disposed on a semiconductor substrate comprising an active area and a termination area, the method further comprising:
    forming a plurality of vertical metal oxide semiconductor field effect transistors (MOSFETs) in the active area and forming a plurality of cascaded lateral MOSFETs in the termination area by forming a plurality of doped floating guard rings (FGRs) each encompassed in a doped diffusion region constituting drain regions and source regions disposed on opposite sides of a gate of each of the cascaded lateral MOSFETs to sustain a high breakdown voltage;
    forming a first field plate comprising a first conductive plate adjacent to an outmost doped diffusion region and electrically connecting the first field plate to the doped FGR encompassed in the outermost doped diffusion region; and
    forming a second field plate comprising a second conductive plate adjacent to an outmost doped FGR in a channel stop region adjacent to a scribe line and electrically connecting the first field plate to the outermost doped FGR.

2. The method of claim 1 further comprising:
    forming an insulation layer between the first field plate and the second field plate to electrically insulate the first field plate from the second field plate.

3. The method of claim 1 wherein:
    the step of forming a plurality of vertical metal oxide semiconductor field effect transistors (MOSFETs) in the active area further comprising a step of forming a plurality of vertical planar MOSFETs in the active area.

4. The method of claim 1 wherein:
the step of forming a plurality of vertical metal oxide semiconductor field effect transistors (MOSFETs) in the active area further comprising a step of forming a plurality of vertical trench MOSFETs in the active area.

5. The method of claim 1 wherein:
the step of forming a plurality of the cascaded lateral MOSFETs in the termination area further comprising a step of forming a plurality of cascaded lateral P-channel MOSFETs in the termination area by forming each of the doped buried floating rings as P-type doped FGRs and connecting the gate of each of the P-channel MOSFET to one of the P-doped FGRs functioning as a drain region of the cascaded lateral P-channel MOSFETs.

6. The method of claim 1 wherein:
the step of forming a plurality of the cascaded lateral MOSFETs in the termination area further comprising a step of forming the plurality of cascaded lateral MOSFETs in the termination area as cascaded lateral planar MOSFETs in the termination area.

7. The method of claim 1 wherein:
the step of forming a plurality of the cascaded lateral MOSFETs in the termination area further comprising a step of forming the plurality of cascaded lateral MOSFETs in the termination area as cascaded lateral trench MOSFETs in the termination area.

8. The method of claim 1 wherein:
the step of forming a plurality of the cascaded lateral MOSFETs in the termination area further comprising a step of forming the plurality of cascaded lateral MOSFETs in the termination area as P-channel cascaded lateral planar MOSFETs by forming each of the doped floating guard rings (FGRs) as P-type doped FGRs and forming the gate of each of the P-channel MOSFET as a planar gate connecting the planar gate to one of the P-doped FGRs functioning as a drain region of the cascaded lateral P-channel planar MOSFETs in the termination area.

9. The method of claim 1 wherein:
the step of forming a plurality of the cascaded lateral MOSFETs in the termination area further comprising a step of forming the plurality of cascaded lateral MOSFETs in the termination area as cascaded lateral trench MOSFETs in the termination area by forming each of the doped floating guard rings (FGRs) as P-type doped FGRs and forming the gate of each of the P-channel MOSFET as a trench gate and connecting the trench gate to one of the P-doped FGRs functioning as a drain region of the cascaded lateral P-channel trench MOSFETs in the termination area.

\* \* \* \* \*